United States Patent
Haussmann et al.

(10) Patent No.: US 6,824,949 B2
(45) Date of Patent: Nov. 30, 2004

(54) POLYBENZOXAZOLE PRECURSORS, PHOTORESIST SOLUTION, POLYBENZOXAZOLE, AND PROCESS FOR PREPARING A POLYBENZOXAZOLE PRECURSOR

(75) Inventors: Jörg Haussmann, Freising (DE); Gerhard Maier, München (DE); Günter Schmid, Hemhofen (DE); Recai Sezi, Röttenbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/008,796

(22) Filed: Nov. 13, 2001

(65) Prior Publication Data

US 2002/0086968 A1 Jul. 4, 2002

Related U.S. Application Data

(63) Continuation of application No. PCT/DE01/00907, filed on Mar. 9, 2001.

(30) Foreign Application Priority Data

Mar. 10, 2000 (DE) .......................................... 100 11 604

(51) Int. Cl.⁷ .......................... G03F 7/004; C08G 69/32

(52) U.S. Cl. .................... 430/170; 430/270.1; 430/906; 528/341; 528/344; 528/346

(58) Field of Search .............................. 430/170, 270.1, 430/906, 907; 528/341, 344, 346

(56) References Cited

U.S. PATENT DOCUMENTS

| 4,172,938 A | * | 10/1979 | Mera et al. | .................. 528/336 |
| 4,393,196 A | * | 7/1983 | Rogers et al. | .............. 528/363 |
| 4,794,159 A | * | 12/1988 | Teramoto et al. | ........... 528/344 |

FOREIGN PATENT DOCUMENTS

| DE | 37 16629 A1 | 12/1988 |
| EP | 0 023 662 A1 | 2/1981 |
| EP | 0 905 169 A2 | 3/1999 |
| EP | 0 905 170 A2 | 3/1999 |

\* cited by examiner

*Primary Examiner*—John S. Chu
(74) *Attorney, Agent, or Firm*—Laurence A. Greenberg; Werner H. Stemer; Gregory L. Mayback

(57) ABSTRACT

There are disclosed polybenzoxazole precursors which can be processed by centrifugal techniques, which can be cyclized to polybenzoxazoles on substrates without difficulty, and which after cyclization to polybenzoxazoles exhibit a high temperature stability. In particular, these precursors and the polybenzoxazoles prepared from them possess high resistance against the diffusion of metals.

20 Claims, No Drawings

POLYBENZOXAZOLE PRECURSORS, PHOTORESIST SOLUTION, POLYBENZOXAZOLE, AND PROCESS FOR PREPARING A POLYBENZOXAZOLE PRECURSOR

CROSS-REFERENCE TO RELATED APPLICATION

This application is a continuation of copending International Application No. PCT/DE01/00907, filed Mar. 9, 2001, which designated the United States.

BACKGROUND OF THE INVENTION

Field of the Invention

The invention concerns novel polybenzoxazole precursors and resist solutions containing these precursors.

In microelectronics, highly heat resistant polymers are required as protective and insulating layers. These kinds of polymers can be used as a dielectric between two metal planes, e.g. in multi-chip modules and memory and logic chips, or as a buffer coat between the chip and its outline. Some of these polymers, for example precursors of aromatic polyimides (PI) and polybenzoxazoles, are readily soluble in organic solvents, have good film-forming properties and can be applied to the electronic components by means of low-cost centrifugal technique. The precursors are then cyclized through heat treatment, i.e. converted into the corresponding polyimide and polybenzoxazole polymer, and thereby acquire their final properties.

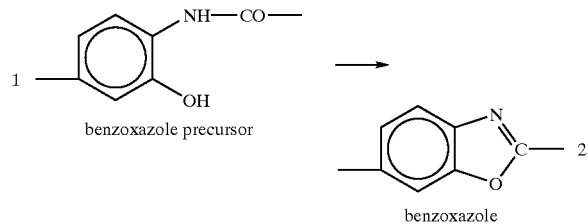

Cyclization results in disappearance of the polar, hydrophilic groups of the PBO precursor (OH, NH and CO), which would otherwise exert a negative influence on the dielectric properties and the water uptake. This is, for example, a significant advantage of polybenzoxazoles in comparison with polyimides and, in particular, in comparison with hydroxypolyimides. However, the cyclization is important not only for the good dielectric properties and the low water uptake of the final product, but also for its high temperature stability.

The specifications for the cyclized final product are very demanding. Thus, for example, in addition to the dielectric constant being as low as possible, the thermal stability must be high.

Polyimides and polybenzoxazoles have the following advantages over many other high-temperature-stable polymers:

In contrast to the cyclized final product, they can be applied to a substrate as a soluble precursor and then cyclized on the substrate, whereby the solubility and therefore the sensitivity towards solvents and other process chemicals is considerably reduced. The processing of pre-cyclized polybenzoxazoles, for example, is difficult for this reason.

Through addition of appropriate photoactive components to the precursors, photosensitive compositions can be produced which enable low-cost direct structuring of the dielectric. Polybenzoxazoles have the further advantage over polyimides that they can be structured in positive mode and developed in aqueous alkali (cf. EP-PS 0 023 662, EP-PS 0 264 678 and EP-PS 0 291 779). For this purpose the PBO precursors used must be soluble in—preferably metal ion free—alkaline developer.

Benzocyclobutene (BCB), which is processed in a similar way and can be negatively structured, has a significantly lower temperature stability than polyimide and polybenzoxazole.

When using polymers of the above kind as a dielectric between metallic conductors it is very important that the metal does not diffuse through the dielectric at elevated temperatures, i.e. at temperatures greater than 300° C. However, many metals, especially aluminum—currently the most commonly used metal—do diffuse through the dielectric at high temperatures. For this reason the metal is provided with a barrier coat, e.g. of titanium nitride or a combination of titanium and titanium nitride, which prevents the diffusion of the metal into the dielectric. However, the use of an additional layer demands a considerably higher outlay of costs and time.

Polybenzoxazole precursors which can be cyclized on substrates and which exhibit good temperature stability are known, for example, from EP-PS 0 023 662, EP-PS 0 264 678, EP-PS 0 291 779, EP-PS 0 905 169, EP-OS 0 905 170 and DE-PS 37 16 629. But there is no information about the diffusion of metals into the polymers prepared from these after cyclization on a substrate (cf. EP-PS 0 264 678 and EP-OS 0 317 942).

SUMMARY OF THE INVENTION

It is accordingly an object of the invention to provide polybenzoxazole precursors that overcome the above-mentioned disadvantages of the prior art materials, which can be processed by means of the centrifugal technique, which can be cyclized to polybenzoxazoles on substrates without difficulty, and which after cyclization to polybenzoxazoles exhibit a high temperature stability. In particular, these precursors and the polybenzoxazoles prepared from them should possess high resistance against the diffusion of metals.

With the foregoing and other objectives in view there are provided, according to the invention, polybenzoxazole precursors containing one of the following partial structures:

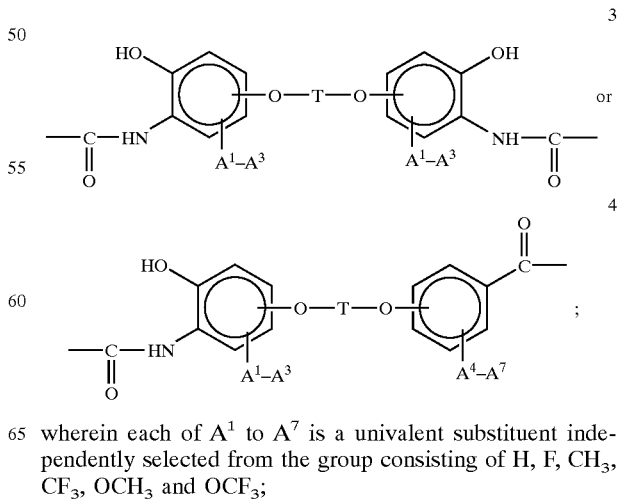

wherein each of $A^1$ to $A^7$ is a univalent substituent independently selected from the group consisting of H, F, $CH_3$, $CF_3$, $OCH_3$ and $OCF_3$;

T is a residue selected from the group consisting of

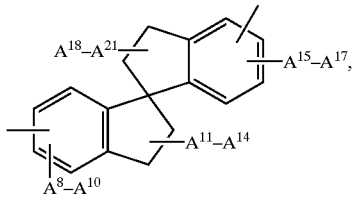

5 wherein each of $A^8$ to $A^{21}$ is a univalent substituent independently selected from the group consisting of H, F, $CH_3$, $CF_3$, $OCH_3$ and $OCF_3$;

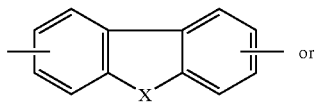 or

6

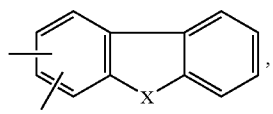,

7 wherein X is selected from the group consisting of —$CH_2$—, —$CF_2$—, —$C(CH_3)_2$—, —$C(CF_3)_2$—, —$C(OCH_3)_2$—, —$C(OCF_3)_2$—, —$C(CH_3)(C_6H_5)$—, —$C(C_6H_5)_2$—, —O—, —(NH)—, —(N—$CH_3$)— and —(N—$C_6H_5$)—;

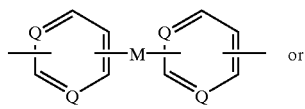 or

8

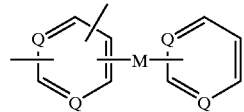

9 wherein M is selected from the group consisting of residues represented by formulas 10–14

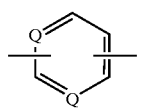

10

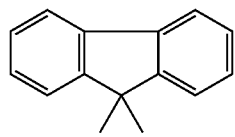

11

12

 or

13

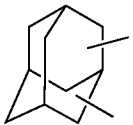

14 in which Q is selected from the group consisting of C—H, C—F, C—$CH_3$, C—$CF_3$, C—$OCH_3$, C—$OCF_3$ and N, and residues represented by formulas 15–34 shown below, in which Q is defined as above, provided that at least one Q signifies N and a maximum of two N atoms are present per ring;

and residues represented by formulas 15–34

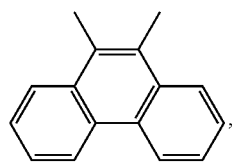,

15

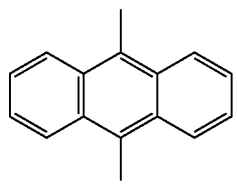,

16

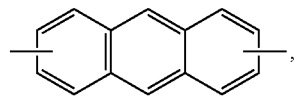,

17

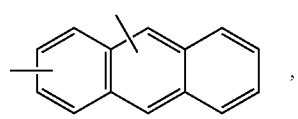,

18

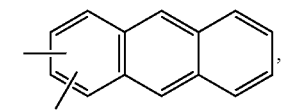,

19

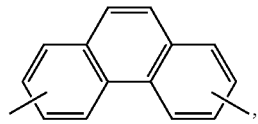,

20

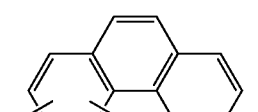,

21

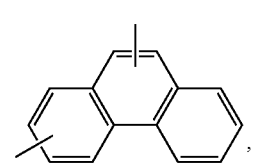,

22

-continued

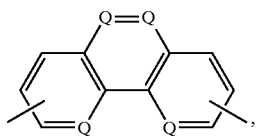  23

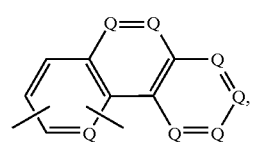  24

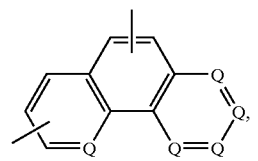  25

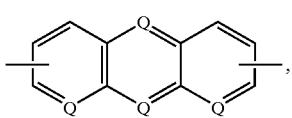  26

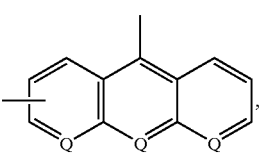  27

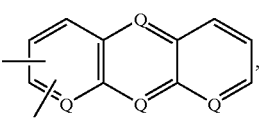  28

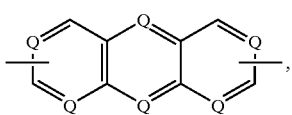  29

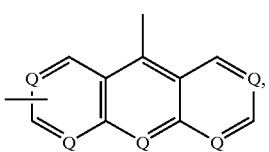  30

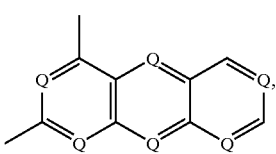  31

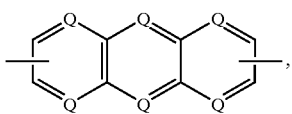  32

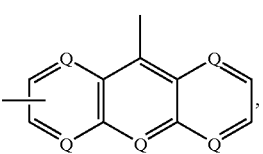  33

-continued

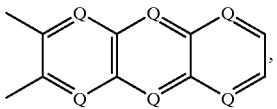  34 wherein Q is defined as above, provided that at least one Q signifies N and a maximum of two N atoms are present per ring.

Dielectrics prepared from polybenzoxazole precursors of this kind exhibit, in particular, a significantly reduced aluminum diffusion. As a result, an additional barrier layer is superfluous.

The metal diffusion can then be reduced still further if acetylene groups are integrated into the precursor molecules. These acetylene groups can be present in the main chain of the precursor molecules, as a terminal group of a precursor molecule, or as a side chain of a precursor molecule.

Preferably the acetylene group is contained in one of the following compounds:

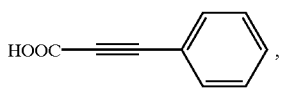  35

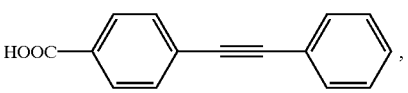  36

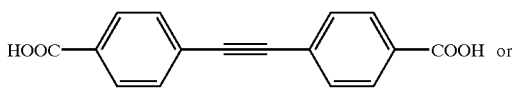  37

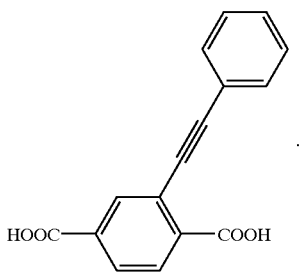  38

With the foregoing and other objectives in view there are also provided, according to the invention processes for preparing polybenzoxazole precursors with the above structure by a self-condensation reaction of an appropriate o-aminophenolcarboxylic acid and by reaction of appropriate bis-o-aminophenols or o-aminophenolcarboxylic acids—whereby in each case one or several of these compounds can be used—with one or more suitable dicarboxylic acid compounds such as dicarboxylic acids and dicarboxylic acid derivatives, in particular active esters and chlorides. Active esters of dicarboxylic acids include, for example, the methyl, t-butyl, and phenyl esters. For this purpose the bis-o-aminophenol or o-aminophenolcarboxvlic acid and the dicarboxylic acid or dicarboxylic acid derivative, when present, are reacted together, suitably in an organic solvent at a temperature from −20 to 150° C., and the resulting polymer precipitated by adding the reaction mixture dropwise to a suitable precipitating agent. The precipitated polymer can be used immediately after being filtered off and dried. Before the precipitation of the polymer, its terminal amino groups can be protected, i.e. blocked, using a dicarboxylic acid anhydride or a monocarboxylic acid chloride. The o-aminophenolcarboxylic acids can also be reacted alone, i.e. without a dicarboxylic acid.

The bis-o-aminophenols and o-aminophenolcarboxylic acids used for preparation of the polybenzoxazole precursors according to the invention have the following respective structures:

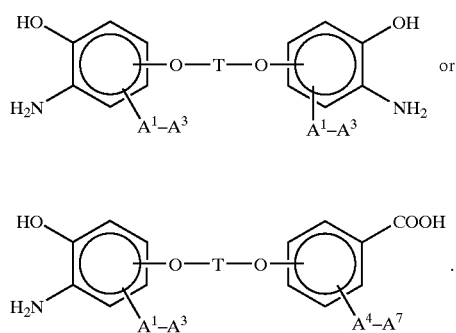

in which $A^1$–$A^3$, $A^4$–$A^7$, and T are as defined above.

These compounds are the subject of German patent application submitted at the same time: File No.

"Bis-o-aminophenols and o-aminophenolcarboxylic acids" (GR 00 P 8529 DE).

The designations "$A^1$–$A^3$", "$A^4$–$A^7$", "$A^8$–$A^{10}$", "$A^{11}$–$A^{14}$", "$A^{15}$–$A^{17}$" and "$A^{18}$–$A^{21}$" in the structural formulae mean that the phenyl groups or cyclic structures carry respectively the residues $A^1$, $A^2$ and $A^3$, or $A^4$, $A^5$, $A^6$ and $A^7$, or $A^8$, $A^9$ and $A^{10}$, or $A^{11}$, $A^{12}$, $A^{13}$ and $A^{14}$, or $A^{15}$, $A^{16}$ and $A^{17}$, or $A^{18}$, $A^{19}$, $A^{20}$ and $A^{21}$.

Examples of this kind of bis-o-aminophenol and o-aminophenolcarboxylic acid are:

9,9-bis(4-[(4-amino-3-hydroxy)phenoxy]phenyl)fluorene

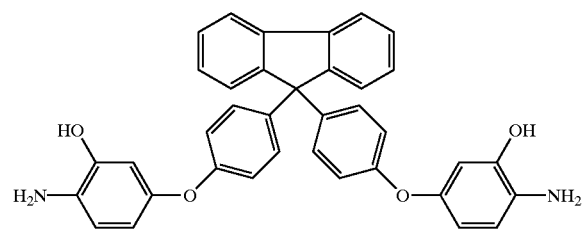

9,10-bis(4-[(4-amino-3-hydroxy)phenoxy]phenyl) anthracene

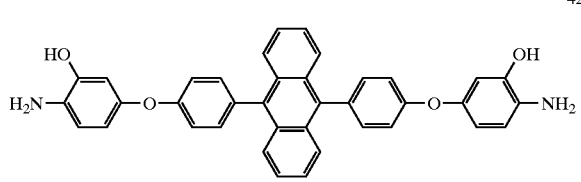

6,6'-bis[(4-amino-3-hydroxy)phenoxy]-5,5'-dimethyl-3,3,3',3'-tetramethyl-1,1'-spiro-bis(indane)

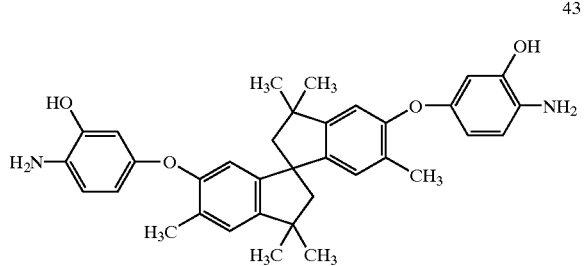

4,7-bis[(4-amino-3-hydroxy)phenoxy]-1,10-phenanthroline

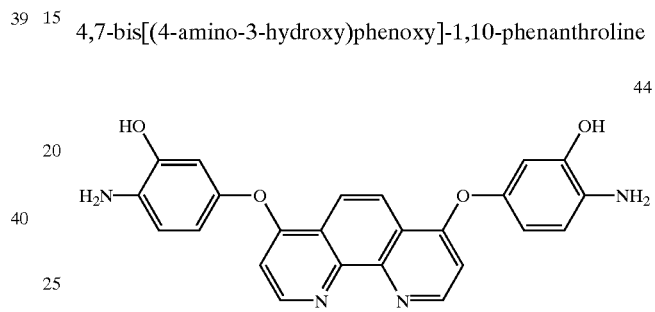

9-(4[(4-amino-3-hydroxy)phenoxy]phenyl)-9-(4[(2-trifluoramethyl-4-carboxy)phenoxy]phenyl) fluorene

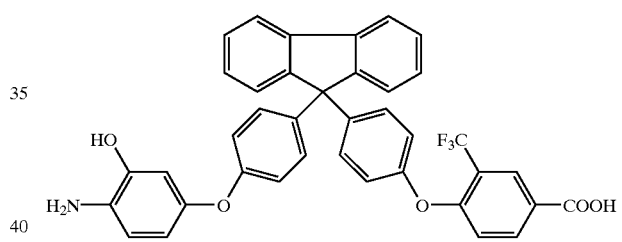

9-(4-[(4-amino-3-hydroxy)phenoxy]phenyl)-10-(4-[(4-carboxy)phenoxy]phenyl) anthracene

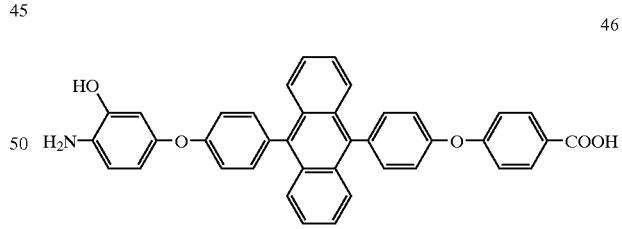

6-[(4-amino-3-hydroxy)phenoxy-6'-[(4-carboxy)phenoxy]-5,5'-dimethyl-3,3,3',3'-tetramethyl-1,1'-spiro-bis(indane)

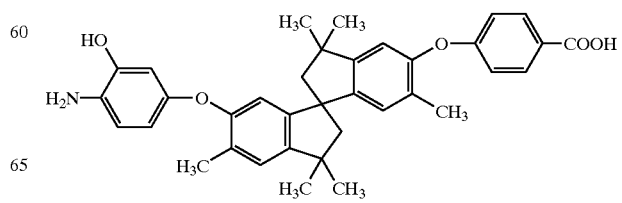

4-[(4-amino-3-hydroxy)phenoxy]-7-[(4-carboxy)phenoxy]-1-10-phenanthroline

48

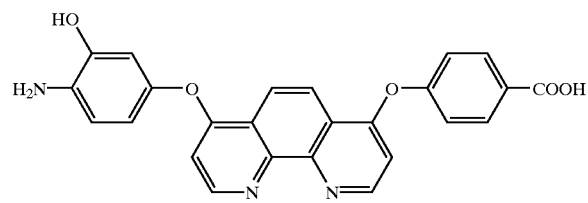

Any dicarboxylic acid can be used in preparing a polybenzoxazole precursor according to the invention. Dicarboxylic acids such as 4,4'-oxybisbenzoic acid, 2,2-bis(4-carboxyphenyl)perfluoropropane and isophthalic acid and mixtures thereof are especially suited for the preparation of the precursors. In principle, however, all dicarboxylic acids can be used which have up to three aromatic nuclei.

A monocarboxylic acid can be used in controlled minor amounts as chain terminator and molecular weight regulator in preparing a polybenzoxazole precursor according to the invention. Aromatic monocarboxylic acids are preferred.

In a particularly preferred embodiment, dicarboxylic acid used in preparing polybenzoxazole precursor according to the invention includes p,p'-ethinylbis(benzoic acid) represented by above formula 37 to integrate the acetylene group into the main chain. Similarly, dicarboxylic acid used in preparing polybenzoxazole precursor according to the invention includes (2'-phenylethinyl)benzene-1,4-dicarboxylic acid represented by above formula 38 to integrate the acetylene group into a side chain.

When a monocarboxylic acid is used as chain terminator, 2-phenylpropynoic acid represented by above formula 35 and/or p-(2'-phenylethinyl)benzoic acid represented by above formula 36 can be used to integrate the acetylene group into the end group.

If dicarboxylic acid chlorides are used for the polymerization, the use of a basic acid scavenger is advantageous. Any basic scavenger can be used. Preferred acid scavengers of this kind are pyridine, triethylamine, diazabicyclooctane and polyvinyl pyridine. However, other basic acid scavengers can also be used, whereby especially preferred are those which are readily soluble both in the solvent used for the synthesis—for example N-methyl pyrrolidone—and in water/alcohol mixtures (precipitating agent), and also those which are completely insoluble in the solvent, for example cross-linked polyvinyl pyridine.

Especially suited as solvents for the polymer synthesis are dimethylacetamide, γ-butyrolactone and N-methylpyrrolidone. In principle, however, any solvent can be used in which the starting materials are readily soluble. Especially suitable precipitating agents are water and mixtures of water with different alcohols, for example ethanol and isopropanol.

The polymer precursors according to the invention are readily soluble in many organic solvents, such as acetone, cyclohexanone, diethylene mono- and diethyl ether, N-methylpyrrolidone, γ-butyrolactone, ethyl lactate, tetrahydrofuran and ethyl acetate, as well as in aqueous alkaline metal-ion-free developers, and can be processed without problems by means of centrifugal technique. After cyclization on the substrate the polybenzoxazoles obtained as the product exhibit considerably reduced aluminum diffusion—in comparison with materials of prior art—and enhanced high temperature stability.

The polymer precursors according to the invention are compatible with diazoketones and are therefore advantageously suited for photoresist solutions which—dissolved in a solvent—contain a polybenzoxazole precursor and a diazoketone based photoactive component. Surprisingly, such photoactive compositions exhibit high resolution and a very good film quality. Preferred diazoketones include diazoquinones such as naphthoquinonediazide-5-sulfonic acid.

In the photoresist solutions the ratio by weight of polybenzoxazole precursor to diazoquinone is advantageously in the range from 1:20 to 20:1, preferably from 1:10 to 10:1.

The polybenzoxazoles corresponding to the polybenzoxazole polymer precursors according to the invention include the following partial structures:

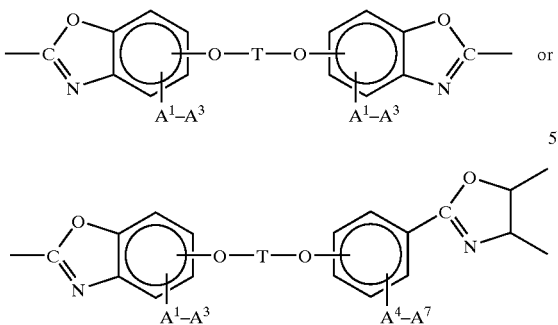

wherein $A^1$ to $A^7$ and T have the meanings given above.

In the polybenzoxazole polymer precursors according to the invention, and in the corresponding polybenzoxazoles, the indicated partial structures according to the invention are linked together and to residues of such dicarboxylic acids and monocarboxylic acids as are used in their preparation.

Although the invention is illustrated and described herein as embodied in polybenzoxazole precursors and processes for their preparation and utilization, it is nevertheless not intended to be limited to the details shown, since various modifications and structural changes may be made therein without departing from the spirit of the invention and within the scope and range of equivalents of the claims.

The practice and method of operation of the invention, however, together with additional objects and advantages thereof will be best understood from the following description in greater detail on the basis of exemplary embodiments:

EXAMPLE 1

Preparation of a Bis-o-aminophenol
9,9-bis(4-[(4-amino-3-hydroxy)phenoxy]phenyl)fluorene
100.0 g of 9,9-bis(4-hydroxyphenyl)fluorene (0.285 mol) and
142.5 g of 3-fluoro-6-nitrobenzyloxyphenol (0.576 mol) are dissolved in 1050 ml of dimethylformamide. 200.0 g of $K_2CO_3$ (1.447 mol) is then added and the mixture heated with constant stirring for 3 h at 135° C. On completion of the reaction the mixture is cooled to room temperature and poured with stirring into 2.5 l of ice water. The resulting yellow solid which precipitates is filtered off using a Büchner funnel, washed once with dilute acetic acid and once with water and then dried in a vacuum chamber under nitrogen at 50° C./50 mbar.

For purification the crude product is dissolved in 800 ml of boiling tetrahydrofuran and 800 ml of aliphatic petroleum hydrocarbon (b.p. 60 to 80° C.) is added. The solution is allowed to stand for 12 h at 4° C. for crystallization and the product then filtered off by means of a Büchner funnel to give a white solid, which is dried in a vacuum chamber under nitrogen at 50° C./50 mbar.

70.0 g of 9,9-bis(4-[(3-benzyloxy-4-nitro)phenoxy] phenyl)fluorene (0.087 mol) prepared in this way is dissolved in 700 ml of tetrahydrofuran, 7.0 g of palladium on active charcoal is added to the solution and the suspension hydrogenated in an autoclave at room temperature with hydrogen at a pressure of 2 bar; the reaction is complete after 24 h. The suspension is then filtered through a Büchner funnel and the red filtrate is evaporated to dryness in a rotary evaporator.

The crude product is purified by dissolving it in 500 ml of boiling tetrahydrofuran and adding 150 ml of petroleum benzine (b.p. 60 to 80° C.). The solution is allowed to stand for 12 h at 4° C. for crystallization and the product then filtered off by means of a Büchner funnel to give a pale yellow solid, which is dried in a vacuum chamber under nitrogen at 50° C./50 mbar.

EXAMPLE 2

Preparation of a PBO Precursor 56.46 g of 9,9-bis(4-[(4-amino-3-hydroxy)phenoxy] phenyl)fluorene (0.1 mol) prepared in the manner of example 1 is dissolved in 300 ml of distilled N-methylpyrrolidone. This solution is stirred at 10° C., a solution of 20.3 g of terephthalic acid dichloride (0.1 mol) in 150 ml of γ-butyrolactone is added dropwise, and the reaction solution stirred for 16 h. The reaction solution is then treated slowly dropwise at room temperature with a solution of 17.4 g of pyridine (0.22 mol) in 80 ml of γ-butyrolactone and the resulting reaction solution stirred at room temperature for 2 h. The resulting polymer is precipitated by dropwise addition of the reaction solution to a mixture of isopropanol and water (1:3), washed three times with fresh precipitating agent, and dried in a vacuum oven at 50° C./50 mbar for 72 h.

The PBO precursor prepared in this way is readily soluble in solvents such as N-methylpyrrolidone, γ-butyrolactone, acetone, tetrahydrofuran, cyclopentanone, diethyleneglycol monoethyl ether, ethyl lactate and ethanol, and also in commercially available metal-ion-free aqueous alkaline developers such as NMD-W (Tokyo Ohka).

EXAMPLE 3

Determination of Aluminum Diffusion 10 g of the PBO precursor according to example 2 is dissolved in 40 g of distilled N-methylpyrrolidone. Using a plastic syringe fitted with a pre-filter, the solution is applied to a substrate in the form of a cleaned and dried silicon wafer and centrifuged (centrifuge Type ST 146, Convac). The film formed on the substrate is first pre-dried on a hotplate at 120° C. (1 min) and then—for the cyclization (on the substrate)—heated to 350° C. in a programmable laboratory oven ("Sirius Junior", LP-Thermtech AG) under nitrogen (flowrate: 1 l/min, normal pressure) and cured at this temperature for 1 h, and then cooled; the heating up rate and cooling down rate are both 5° C./min. Layer thickness: 1.1 µm.

(a) Purest aluminum (99.999%) is deposited onto a 4" silicon wafer in a sputter apparatus (Z 550, Leybold Heraeus) under the following process conditions: target size 3 inch, substrate grounded, substrate temperature 50° C., power 500 W, sputter gas argon (50 scam), process pressure 3.8 µbar, process time 10 min; the thickness of the deposited aluminum layer is 0.6 µm. A 1 µm thick polybenzoxazole layer is then generated on the aluminum surface as described above and baked out at 350° C. After cooling, the surface is examined microscopically, the light microscope revealing a clean polymer surface. The experiment is repeated at baking temperatures of 400° C. and 450° C. Clean polymer surfaces are also observed in these cases. The underlying aluminum layer also shows no changes in its surface properties.

(b) A 1.1 µm thick polybenzoxazole film is generated on a silicon substrate as described above and baked out at 350° C. A 0.6 µm thick layer of purest aluminum is deposited on this polymer film by sputtering under the above process conditions. The adhesion of the aluminum layer is improved by a 5 s long oxygen plasma treatment (MIE 720, Material Research Corporation; power 900 W, 30 scam oxygen). The substrate is then heated for 1 h in a laboratory oven at 350° C. and then cooled; the rate of heating up and the rate of cooling down are 5° C./min. In order to evaluate diffusion-associated cluster formation, the aluminum layer is detached by immersion in hydrochloric acid (approx. 10%). No changes in the surface of the polymer layer are detectable under the light microscope.

The experiment is repeated at baking out temperatures of 400° C. and 450° C. In neither case is cluster formation observed.

(c) If an alloy of aluminum with copper and silicon (AlCuSi) is used instead of purest aluminum, the same results are obtained as under (a) and (b) above. In this case an AlCuSi target is used in the sputter apparatus instead of a target of purest aluminum.

The same results are also obtained if aluminum is not sputtered, but applied by vapor deposition.

EXAMPLE 4

Photostructuring 4 g of the PBO precursor according to example 2 is dissolved in 15 g of N-methylpyrrolidone together with 1 g of a diester from bisphenol A and naphthoquinonediazide-5-sulfonic acid (photoactive component). By means of a plastic syringe fitted with a pre-filter, this photoresist solution is applied to a substrate in the form of a cleaned and dried silicon wafer, and centrifuged (centrifuge Type ST 146, Convac). The film of photoresist generated on the substrate is first pre-dried on a hotplate at 120° C. and then exposed through a mask in an exposure apparatus (Type 121, Karl Süss). After development with an aqueous alkaline developer (NMD-W, Tokyo Ohka, diluted 1:1 with water) and cyclization (on the substrate) at 350° C. according to example 3, high-temperature-stable resist structures are obtained.

EXAMPLE 5

Determination of the Aluminum Diffusion

Using a photoresist solution according to example 4, the aluminum diffusion is determined according to example 3. The same results are obtained as for the solution of the PBO precursor.

EXAMPLE 6

Determination of the Aluminum Diffusion (Comparative Experiment)

The determination is performed according to example 3, using a PBO precursor from 3,3'-dihydroxybenzidine and isophthalic acid dichloride (cf. EP-PS 0 023 662: example 1; without photoactive component). After curing according to example 3 (a) it is clearly apparent that aluminum is diffused through the polymer (polybenzoxazole) to the polymer surface. Under the light microscope it is possible to recognize not only small particles, but also larger aluminum clusters (hillocks). At a baking temperature of 350° C. a moderate aluminum diffusion is observed; at 400° C. the diffusion is considerable and at 450° C. it is strong.

In an experiment performed according to 3 (b) it is determined that the polymer surface is very rough after detachment of the aluminum and exhibits numerous "holes" in the micrometer range. This is a certain indication of aluminum diffusion.

The same results are obtained if the PBO precursor is used together with a photoactive component (cf. EP-PS 0 023 662).

EXAMPLE 7
Determination of Aluminum Diffusion (Comparative Experiment)

The determination is performed according to example 3 and example 6 using a PEO precursor from hexafluoro-2,2-bis(3-amino-4-hydroxyphenyl)propane, isophthalic acid dichloride and terephthalic acid dichloride (cf. EP-PS 0 264 678: example 1). The results are the same as those of example 6, i.e. aluminum diffuses through the polymer.

EXAMPLE 8
Preparation of a PBO Precursor and Determination of the Properties A PBO precursor is prepared analogously to example 2, under the same conditions but using isophthalic acid dichloride (0.1 mol, i.e. 20.3 g) as the dicarboxylic acid dichloride.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 9
Preparation of a PBO Precursor and Determination of the Properties A PBO precursor is prepared analogously to example 2, under the same conditions but using p-phenylene-$\beta,\beta$-diacrylic acid dichloride (0.1 mol, i.e. 25.5 g) as the dicarboxylic acid dichloride.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 10
Preparation of a PBO Precursor and Determination of the Properties A PBO precursor is prepared analogously to example 2, under the same conditions but using diphenylether-4,4'-dicarboxylic acid dichloride (0.1 mol, i.e. 29.51 g) as the dicarboxylic acid dichloride.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 11
Preparation of a PBO Precursor and Determination of the Properties The PBO precursor described in example 10 can also be prepared in a chloride-free manner as follows: 25.82 g of diphenylether-4,4'-dicarboxylic acid (0.1 mol) is dissolved in 200 ml of N-methylpyrrolidone and treated portionwise with 34.1 g of carbonyldiimidazole (0.21 mol). After gas evolution has subsided the reaction mixture is stirred for a further 2 hours. The suspension obtained is then added to a solution of 56.46 g of 9,9-bis(4-[(4-amino-3-hydroxy)phenoxy]phenyl)fluorene (0.1 mol) in 300 ml of N-methylpyrrolidone and the resulting mixture stirred for 40 h at room temperature, whereby the reaction mixture becomes a clear solution once again. Precipitation and drying of the PBO precursor is performed as in example 2.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 12
Preparation of a PBO Precursor and Determination of the Properties A PBO precursor is prepared analogously to example 2, under the same conditions but using 9,10-bis(4-[(4-amino-3-hydroxy)phenoxy]phenyl)anthracene (0.1 mol, i.e. 57.67 g) as the bis-o-aminophenol and using isophthalic acid dichloride (0.1 mol, i.e. 20.3 g) as the dicarboxylic acid dichloride. The bis-o-aminophenol is prepared—analogously to example 1—from 9,10-bis(4-hydroxyphenyl)anthracene and 3-fluoro-6-nitrobenzyloxyphenol.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 13
Preparation of a PBO Precursor and Determination of the Properties A PBO precursor is prepared analogously to example 2, under the same conditions but using 6,6'-bis[(4-amino-3-hydroxy)phenoxy]-5,5'-dimethyl-3,3,3',3'-tetramethyl-1,1'-spiro-bis(indane) (0.1 mol, i.e. 55.07 g) as the bis-o-aminophenol and using terephthalic acid dichloride (0.1 mol, i.e. 20.3 g) as the dicarboxylic acid dichloride. The bis-o-aminophenol is prepared—analogously to example 1—from 6,6'-dihydroxy-5,5'-dimethyl-3,3,3',3'-tetramethyl-1,1'-spiro-bis(indane) and 3-fluoro-6-nitrobenzyloxyphenol.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 14
Preparation of a PBO Precursor and Determination of the Properties A PBO precursor is prepared analogously to example 2, under the same conditions but using 4,7-bis[(4-amino-3-hydroxy)phenoxy]-1,10-phenanthroline (0.1 mol, i.e. 42.64 g) as the bis-o-aminophenol and using diphenylether-4,4'-dicarboxylic acid dichloride (0.1 mol, i.e. 29.51 g) as the dicarboxylic acid dichloride. The bis-o-aminophenol is prepared—analogously to example 1—from 4,7-dihydroxy-1,10-phenanthroline and 3-fluoro-6-nitrobenzyloxyphenol.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 15

Preparation of an o-aminophenolcarboxylic Acid 9-(4-[(4-amino-3-hydroxy)phenoxy]phenyl)-9-(4-[(2-trifluoromethyl-4-carboxy)phenoxy]phenyl)fluorene 50.0 g of 9,9-bis(4-hydroxyphenyl)fluorene (0.143 mol) and 35.28 g of 3-fluoro-6-nitrobenzyloxyphenol (0.143 mol) are dissolved in 550 ml of dimethylformamide. After addition of 100.0 g of $K_2CO_3$ (0.724 mol) the mixture is heated for 5 h at 120° C. with constant stirring. At the end of the reaction the mixture is cooled to room temperature and poured with stirring into 1.0 l of ice water. The resulting yellow precipitate is collected using a Buchner funnel, washed once with dilute acetic acid and once with water, and then dried under nitrogen in a vacuum chamber at 50° C./50 mbar.

The crude product is purified by recrystallization according to example 1 with 350 ml of tetrahydrofuran and 350 ml of petroleum benzine.

50.0 g of the 9-(4-[(3-benzyloxy-4-nitro)phenoxy]phenyl)-9-(4-hydroxyphenyl)fluorene (0.0866 mol) prepared in this way and 25.83 g of 4-fluoro-3-trifluoromethylbenzoic acid benzyl ester (0.0866 mol) are dissolved in 400 ml of dimethylformamide. After addition of 31.4 g of $K_2CO_3$ (0.2272 mol) the mixture is heated for 3 h at 135° C. with constant stirring. At the end of the reaction the mixture is cooled to room temperature, filtered through a fluted filter and poured into 1 l of water. After three successive extractions with a total of 600 ml of ethyl acetate the combined organic phases are washed twice more with water and the colorless solution obtained evaporated to dryness in a rotary evaporator to yield a white solid.

The crude product is purified by recrystallization according to example 1 with 350 ml of tetrahydrofuran and 350 ml of petroleum benzine.

50.0 g of the 9-(4-[(3-benzyloxy-4-nitro)phenoxy]phenyl)-9-(4-[(2-trifluoromethyl-4-benzylcarboxy)phenoxy]phenyl)fluorene (0.058 mol) prepared in this way is dissolved in 700 ml of tetrahydrofuran, 5.0 g of palladium on active charcoal is added to the solution and the suspension hydrogenated in an autoclave at room temperature with hydrogen at a pressure of 2 bar; the reaction is complete after 24 h. The suspension is then filtered through a Buchner funnel and the pale brown filtrate is evaporated to dryness in a rotary evaporator.

The crude product is purified by. recrystallization according to example 1 with 350 ml of tetrahydrofuran and 100 ml of petroleum benzine.

EXAMPLE 16

Preparation of a PBO Precursor and Determination of the Properties 64.56 g of 9-(4-[(4-amino-3-hydroxy)phenoxy]phenyl)-9-(4-[(2-trifluoromethyl-4-carboxy)phenoxy]phenyl)fluorene prepared according to example 15 is dissolved in 350 ml of distilled N-methylpyrrolidone. A solution of 13 g of oxalyl chloride (0.102 mol) in 80 ml of γ-butyrolactone is added to this solution slowly dropwise at 0° C. After the addition the mixture is stirred for a further 2 h at 0° C. and then for 18 h at room temperature (23° C.). In order to complete the reaction, the mixture is cooled to 0° C., a solution of 20 ml of pyridine in 100 ml of N-methylpyrrolidone is added, and the solution is stirred for a further 24 h at room temperature(23° C.). The solution is then filtered through a Büchner funnel and added dropwise with vigorous stirring to a mixture of isopropanol and water (1:3). The volume of precipitating agent (isopropanol/water) is selected to be 10 times the volume of the reaction solution. The precipitated polymer is collected in a Büchner funnel and washed three times with 1% ammonia solution. The polymer is then dried in a vacuum chamber for 72 h under nitrogen at 40° C./10 mbar.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 17

Preparation of a PBO Precursor and Determination of the Properties

A PBO precursor is prepared analogously to example 16, under the same conditions but using 9-(4-[(4-amino-3-hydroxy)phenoxy]phenyl)-10-(4-[(4-carboxy)phenoxy)phenyl)anthracene (0.1 mol, i.e. 58.96 g) as the o-aminophenolcarboxylic acid. The o-aminophenolcarboxylic acid is prepared—analogously to example 15—from 9,10-bis(4-hydroxyphenyl)anthracene, 3-fluoro-6-nitrobenzyloxyphenol and 4-fluorobenzoic acid benzyl ester.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 18

Preparation of a PBO Precursor and Determination of the Properties

A PBO precursor is prepared analogously to example 16, under the same conditions but using 6-[(4-amino-3-hydroxy)phenoxy]-6'-[(4-carboxy)phenoxy]-5,5'-dimethyl-3,3,3',3'-tetramethyl-1,1'-spiro-bis(indane) (0.1 mol, i.e. 56.37 g) as the o-aminophenolcarboxylic acid. The o-aminophenolcarboxylic acid is prepared—analogously to example 15—from 6,6'-dihydroxy-5,5'-dimethyl-3,3,3',3'-tetramethyl-1,1'-spiro-bis(indane), 3-fluoro-6-nitrobenzyloxyphenol and 4-fluorobenzoic acid benzyl ester.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 19

Preparation of a PBO Precursor and Determination of the Properties

A PBO precursor is prepared analogously to example 16, under the same conditions but using 4-[(4-amino-3-hydroxy)phenoxy]-7-[(4-carboxy)phenoxy]-1,10-phenanthroline (0.1 mol, i.e. 43.94 g) as the o-aminophenolcarboxylic acid. The o-aminophenolcarboxylic acid is prepared—analogously to example 15—from 4,7-dihydroxy-1,10-phenanthroline, 3-fluoro-6-nitrobenzyloxyphenol and 4-fluorobenzoic acid benzyl ester.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

EXAMPLE 20

Preparation of a PBO Precursor and Determination of the Properties 56.46 g of 9,9-bis(4-[(4-amino-3-hydroxy)phenoxy]phenyl)fluorene (0.1 mol) prepared according to example 1 is dissolved in 300 ml of distilled N-methylpyrrolidone. This solution is stirred at 10° C. and treated dropwise with a solution of 18.27 g of terephthalic acid dichloride (0.09 mol) in 135 ml of γ-butyrolactone, and the reaction solution stirred for 16 hours. In order to block the terminal groups, the solution is then stirred at 10° C. and treated dropwise with a solution of 4.81 g of 4-(phenylethinyl)benzoyl chloride (0.02 mol) in 30 ml of γ-butyrolactone, and the reaction solution stirred for 16 hours. Then, a solution of 17.4 g of pyridine (0.22 mol) in 80 ml of γ-butyrolactone is added slowly dropwise at room temperature and the reaction solution obtained is stirred at room temperature for 2 hours. The resulting polymer is precipitated by adding the reaction solution dropwise to a mixture of isopropanol and water (1:3), washed three times with fresh precipitating agent, and dried in a vacuum oven for 72 h at 50° C./10 mbar.

The PBO precursor obtained is readily soluble in the solvents listed in example 2. Photostructuring according to example 4 reveals that a resist material prepared using this precursor is readily structured. Investigations of aluminum diffusion according to example 3 and example 5 produce the same results as these examples.

Other features which are considered as characteristic for the invention are set forth in the appended claims.

We claim:

1. A polybenzoxazole precursor comprising a partial structure selected from the group consisting of

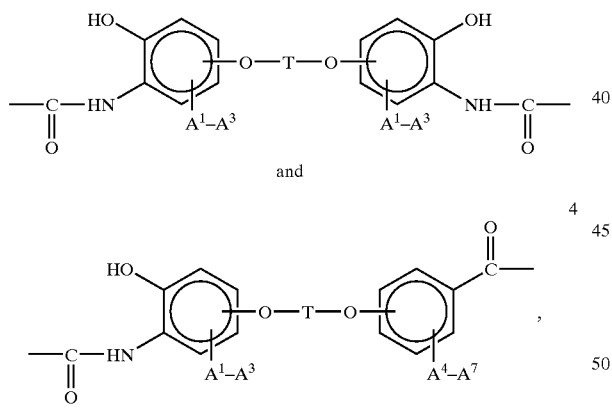

wherein each of $A^1$ to $A^7$ is a univalent substituent independently selected from the group consisting of H, F, $CH_3$, $CF_3$, $OCH_3$ end $OCF_3$;

T is a residue selected from the group consisting of

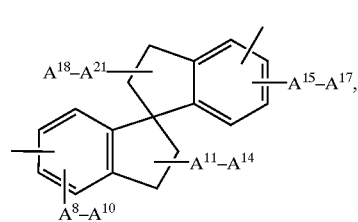

wherein each of $A^8$ to $A^{21}$ is a univalent substituent independently selected from the group consisting of H, F, $CH_3$, $CF_3$, $OCH_3$ and $OCF_3$;

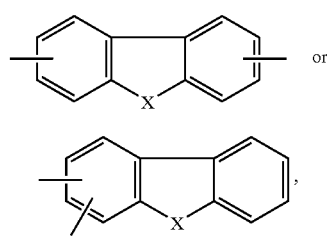

wherein X is selected from the group consisting of $-CH_2-$, $-CF_2-$, $-C(CH_3)_2-$, $-C(CF_3)_2-$, $-C(OCH_3)_2-$, $-C(OCF_3)_2-$, $-C(CH_3)(C_6H_5)-$, $-C(C_6H_5)_2-$, $-O-$, $-(NH)-$, $-(N-CH_3)-$ and $-(N-C_6H_5)-$;

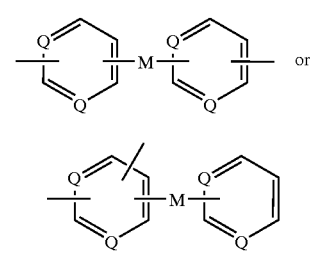

wherein M is selected from the group consisting of residues represented by formulas 10–14

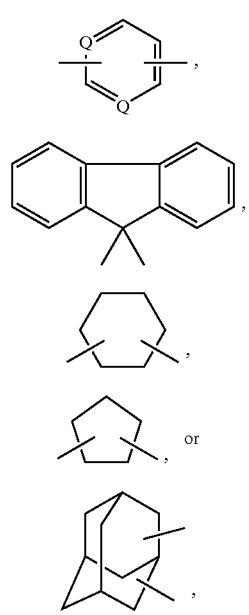

in which Q is selected from the group consisting of C—H, C—F, C—$CH_3$, C—$CF_3$, C—$OCH_3$, C—$OCF_3$ and N, and residues represented by formulas 15–34 shown below:

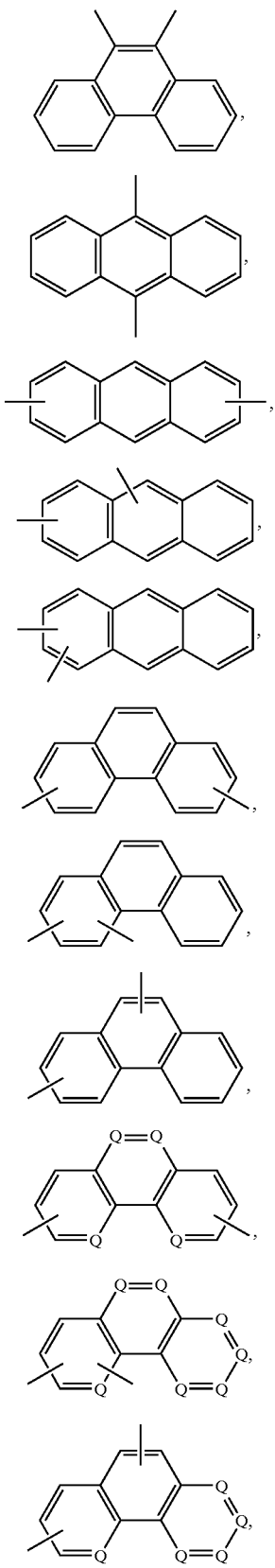

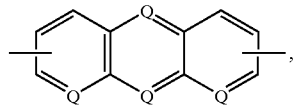

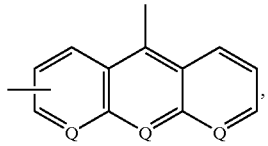

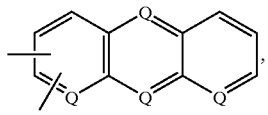

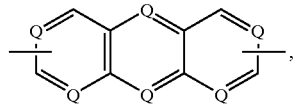

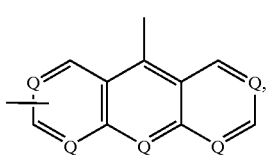

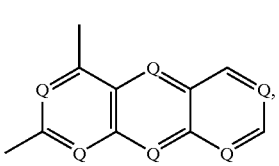

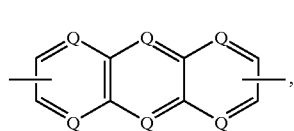

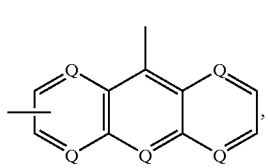

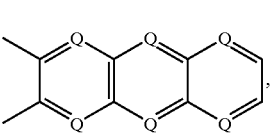

wherein Q is defined as above, provided that at least one Q signifies N and a maximum of two N atoms are present per ring.

2. The polybenzoxazole precursor of claim 1, further comprising at least one acetylene group.

3. The polybenzoxazole precursor of claim 2, wherein said acetylene group is present in the main chain.

4. The polybenzoxazole precursor of claim 2, wherein said acetylene group is present in a side chain.

5. The polybenzoxazole precursor of claim 2, wherein said acetylene group is present in a chain terminating group.

6. The polybenzoxazole precursor of claim 2, wherein said acetylene group is present in the residue of a carboxylic acid selected from the group consisting of

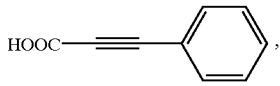   35

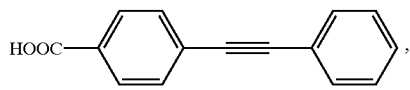   36

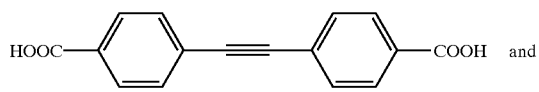   37

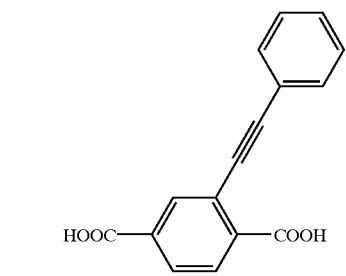   38

7. A photoresist solution, comprising a polybenzoxazole precursor of claim 1, a diazoketone photoactive component, and an organic solvent.

8. The photoresist solution of claim 7, wherein the weight ratio of polybenzoxazole precursor to diazoketone is in the range from 1:20 to 20:1.

9. The photoresist solution of claim 8, wherein a weight ratio of polybenzoxazole precursor to diazoketone is in a range from 1:10 to 10:1.

10. A polybenzoxazole containing a partial structure selected from the group consisting of

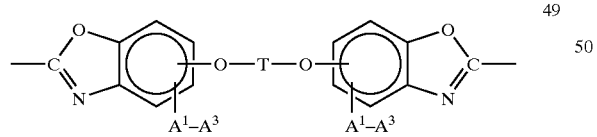   49

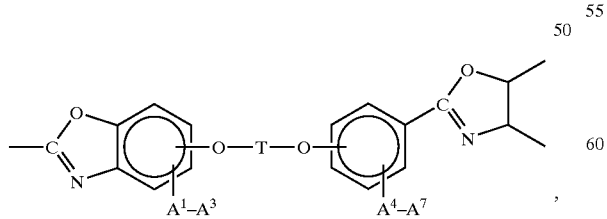   50 wherein each of $A^1$ to $A^7$ is a univalent substituent independently selected from the group consisting of H, F, $CH_3$, $CF_3$, $OCH_3$ and $OCF_3$; and T is a residue selected from the group consisting of the residues represented by the following formulas

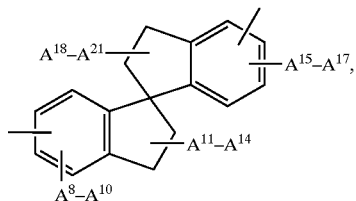   5 wherein each of $A^8$ to $A^{21}$ is a univalent substituent independently selected from the group consisting of H, F, $CH_3$, $CF_3$, $OCH_3$ and $OCF_3$;

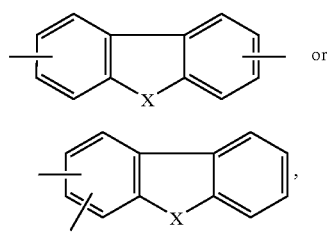   6

7 wherein X is selected from the group consisting of $-CH_2-$, $-CF_2-$, $-C(CH_3)_2-$, $-C(CF_3)_2-$, $-C(OCH_3)_2-$, $-C(OCF_3)_2-$, $-C(CH_3)(C_6H_5)-$, $-C(C_6H_5)_2-$, $-O-$, $-(NH)-$, $-(N-CH_3)-$ and $-(N-C_6H_5)-$;

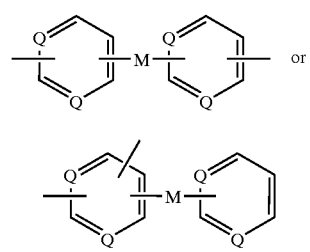   8

9 wherein M is selected from the group consisting of residues represented by formulas 10–14

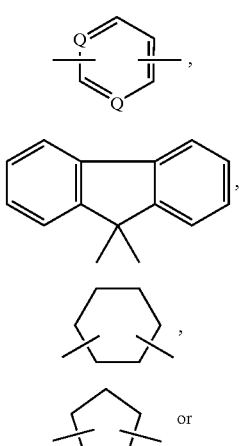   10

11

12

13

-continued
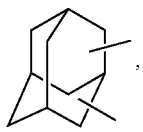
14
in which Q is selected from the group consisting of C—H, C—F, C—CH$_3$, C—CF$_3$, C—OCH$_3$, C—OCF$_3$, and N,
and residues represented by formulas 15–34 shown below:
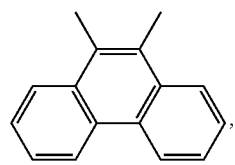
15
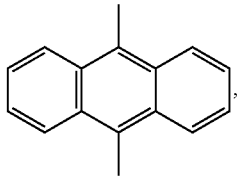
16
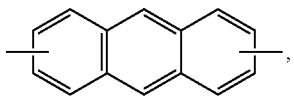
17
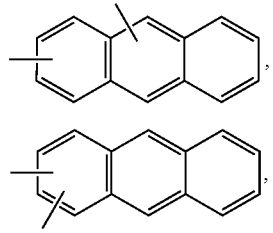
18
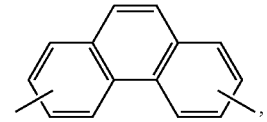
19
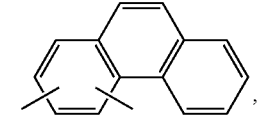
20
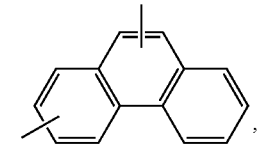
21
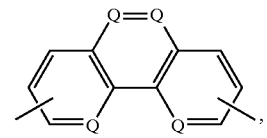
22
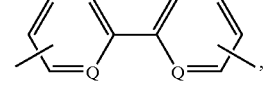
23
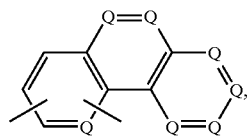
24
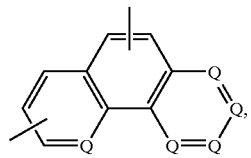
25
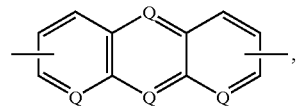
26
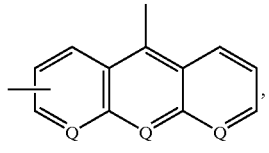
27
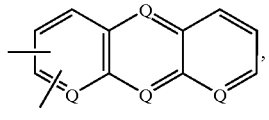
28
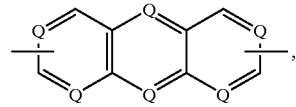
29
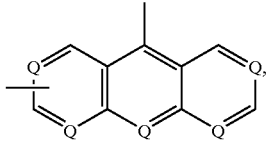
30
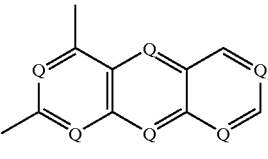
31
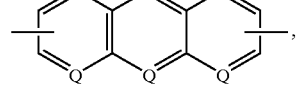
32
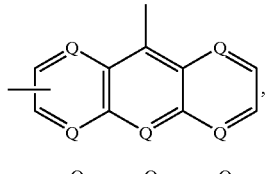
33
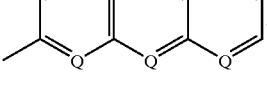
34
wherein Q is defined as above, provided that at least one Q signifies N and a maximum of two N atoms are present per ring.

11. The polybenzoxazole precursor of claim 1, wherein said partial structure is

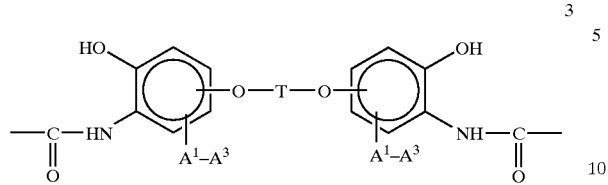

3 wherein each of $A^1$ to $A^3$ is a univalent substituent independently selected from the group consisting of H, F, CH$_3$, CF$_3$, OCH$_3$ and OCF$_3$; and T is a residue selected from the group consisting of the residues represented by the following formulas

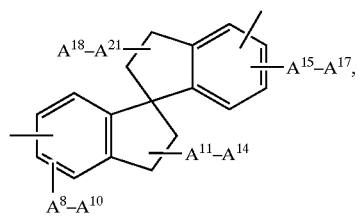

5 wherein each of $A^8$ to $A^{21}$ is a univalent substituent independently selected from the group consisting of H, F, CH$_3$, CF$_3$, OCH$_3$ and OCF$_3$;

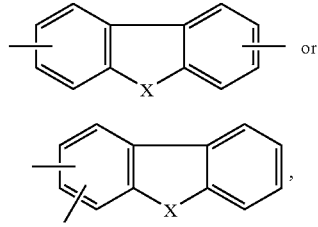

6

7 wherein X is selected from the group consisting of —CH$_2$—, —CF$_2$—, —C(CH$_3$)$_2$—, —C(CF$_3$)$_2$—, —C(OCH$_3$)$_2$—, —C(OCF$_3$)$_2$—, —C(CH$_3$)(C$_6$H$_5$)—, —C(C$_6$H$_5$)$_2$—, —O—, —(NH)—, —(N—CH$_3$)— and —(N—C$_6$H$_5$)—;

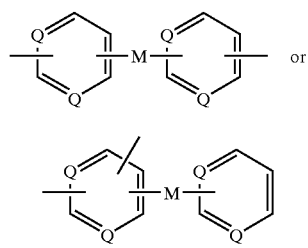

8

9 wherein M is selected from the group consisting of residues represented by formulas 10–14

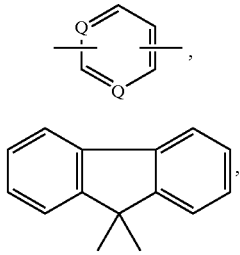

10

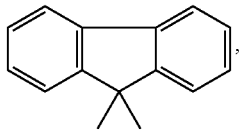

11

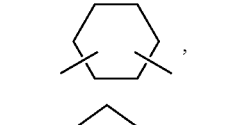

12

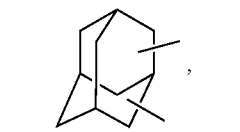

13 or

14 in which Q is selected from the group consisting of C—H, C—F, C—CH$_3$, C—CF$_3$, C—OCH$_3$, C—OCF$_3$ and N, and residues represented by formulas 15–34 shown below:

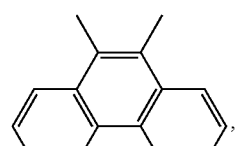

15

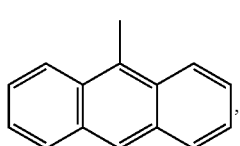

16

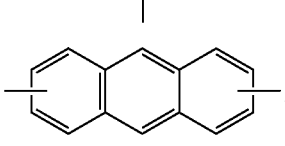

17

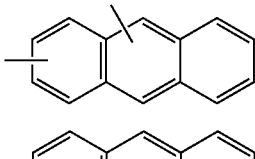

18

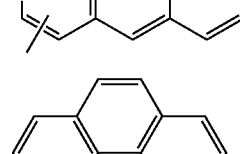

19

20

27

-continued

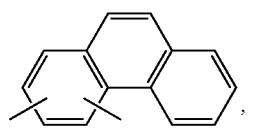
21

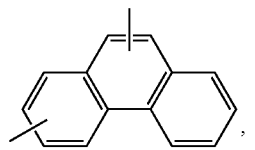
22

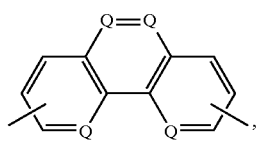
23

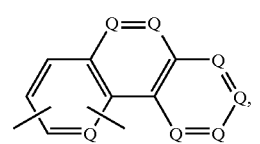
24

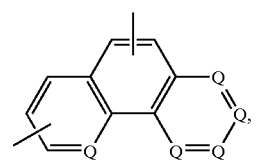
25

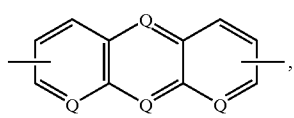
26

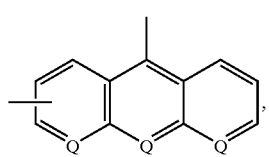
27

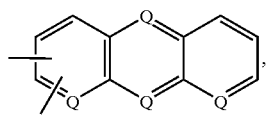
28

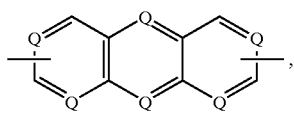
29

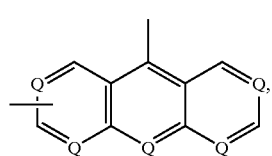
30

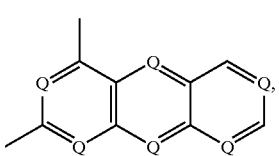
31

28

-continued

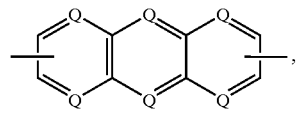
32

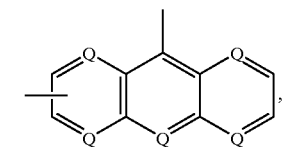
33

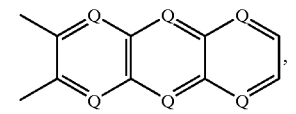
34 wherein Q is defined as above, provided that at least one Q signifies N and a maximum of two N atoms are present per ring.

12. The polybenzoxazole precursor of claim 1, wherein said partial structure is

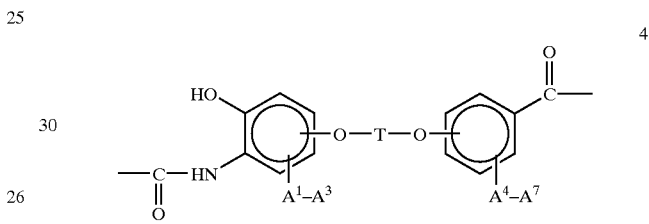
4 wherein each of $A^1$ to $A^7$ is a univalent substituent independently selected from the group consisting of H, F, $CH_3$, $CF_3$, $OCH_3$ and $OCF_3$; and T is a residue selected from the group consisting of the residues represented by the following formulas

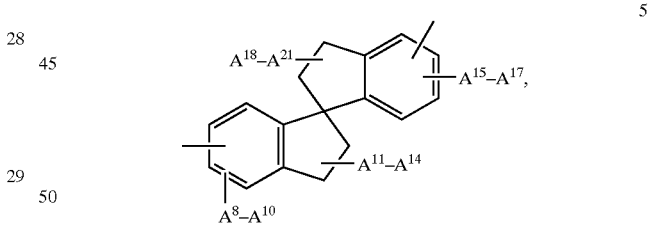
5 wherein each of $A^8$ to $A^{21}$ is a univalent substituent independently selected from the group consisting of H, F, $CH_3$, $CF_3$, $OCH_3$ and $OCF_3$;

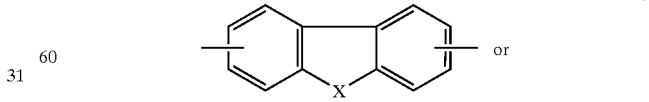
6 or

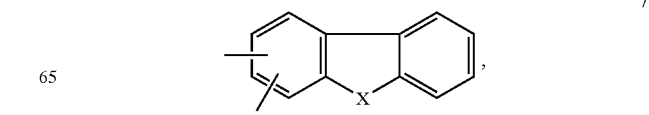
7 wherein X is selected from the group consisting of —CH$_2$—, —CF$_2$—, —C(CH$_3$)$_2$—, —C(CF$_3$)$_2$—, —C(OCH$_3$)$_2$—, —C(OCF$_3$)$_2$—, —C(CH$_3$)(C$_6$H$_5$)—, —C(C$_6$H$_5$)$_2$—, —O—, —(NH)—, —(N—CH$_3$)— and —(N—C$_6$H$_5$)—;

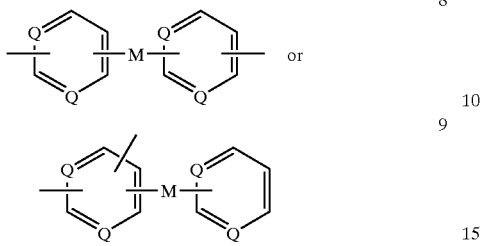

wherein M is selected from the group consisting of residues represented by formulas 10–14

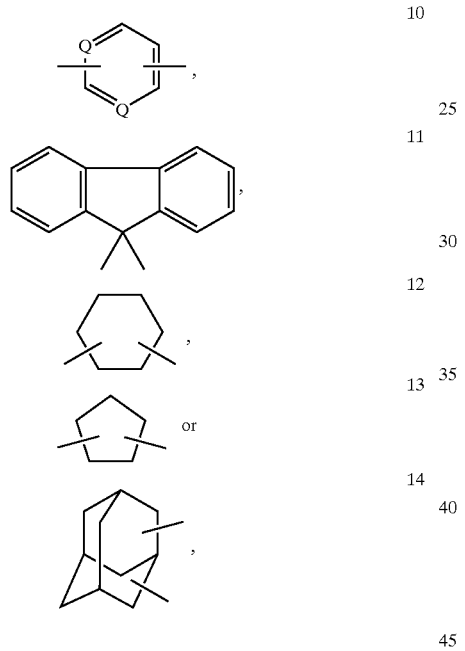

in which Q is selected from the group consisting of C—H, C—F, C—CH$_3$, C—CF$_3$, C—OCH$_3$, C—OCF$_3$ and N, and residues represented by formulas 15–34 shown below:

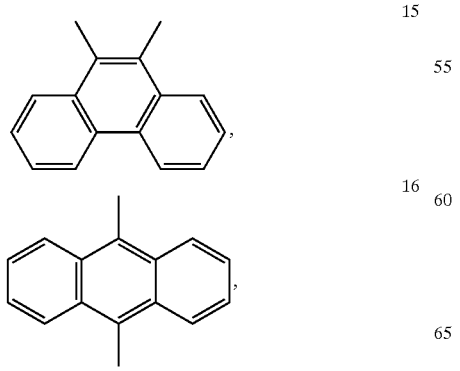

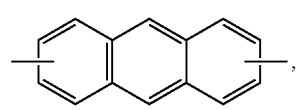

17

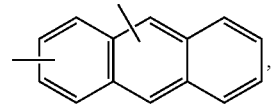

18

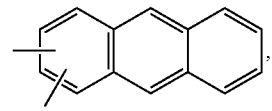

19

20

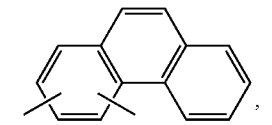

21

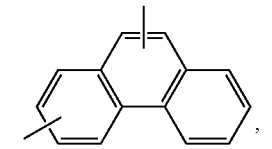

22

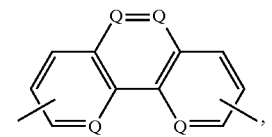

23

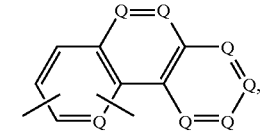

24

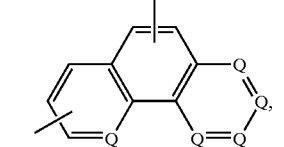

25

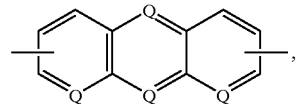

26

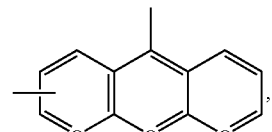

27

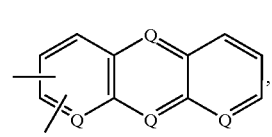

28

-continued

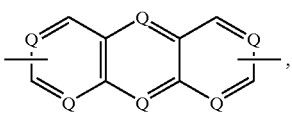  29

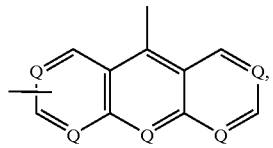  30

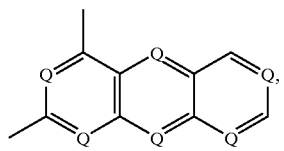  31

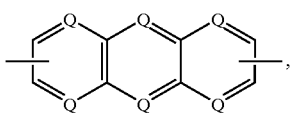  32

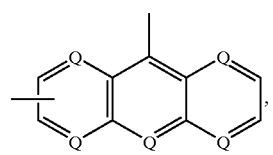  33

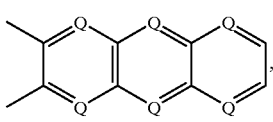  34 wherein Q is defined as above, provided that at least one Q signifies N and a maximum of two N atoms are present per ring.

13. The polybenzoxazole precursor of claim 1, wherein each of $A^1$ to $A^7$ is H.

14. The polybenzoxazole precursor of claim 1, wherein T is

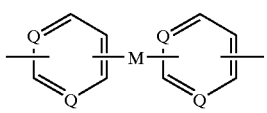  8 in which each Q is CH and M is

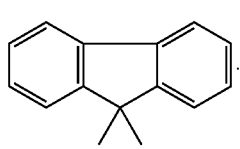  11

15. The polybenzoxazole precursor of claim 1, wherein T is

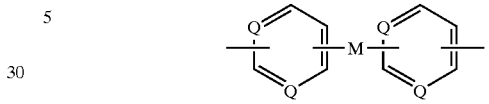  8 in which each Q is CH and M is

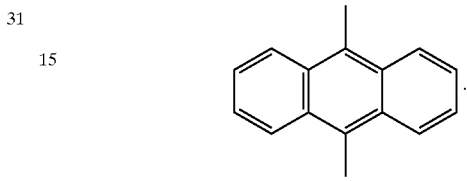  16

16. The polybenzoxazole precursor of claim 1, wherein T is

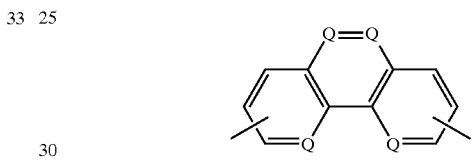  23 in which Q in each outside ring is N and each Q in the middle ring is CH.

17. The polybenzoxazole precursor of claim 1, wherein T is

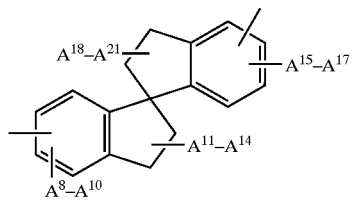  5 in which six of the substituents $A^8$ to $A^{21}$ are $CH_3$ and the remainder of the substituents $A^8$ to $A^{21}$ are H.

18. The polybenzoxazole precursor of claim 5, wherein said chain terminating group is a residue of

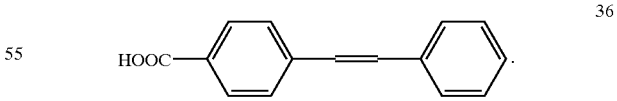  36

19. The polybenzoxazole precursor of claim 18, wherein T is

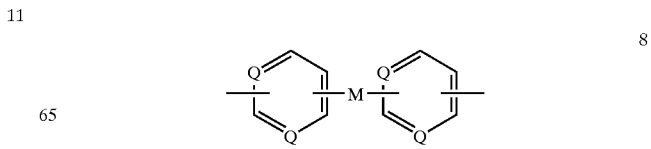  8 in which each Q is CH and M is

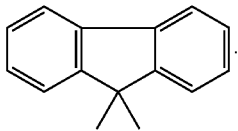

20. A process for preparing a polybenzoxazole precursor containing a partial structure selected from the group consisting of

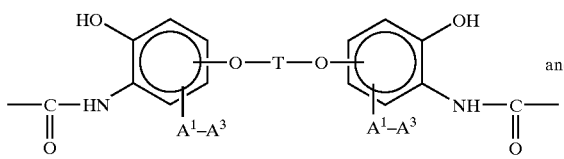

and

HO—[benzene ring with C(=O)—HN and A¹–A³ substituents]—O—T—O—[benzene ring with A⁴–A⁷ and C(=O)—]

wherein each of A¹ to A⁷ and T are as defined above, comprising the steps of providing at least one reactant selected from the group consisting of bis-o-aminophenols and o-aminophenolcarboxylic acids, causing the reactant to react with at least one dicarboxylic acid compound, mixing the reaction mixture with a precipitating agent to precipitate a solid polybenzoxazole precursor, and isolating the polybenzoxazole precursor from the reaction mixture.

* * * * *